(12) United States Patent
Su et al.

(10) Patent No.: US 10,879,054 B2
(45) Date of Patent: Dec. 29, 2020

(54) PUMP ASSEMBLY FOR CREATING VACUUM IN WAFER PROCESSING CHAMBER

(71) Applicant: Taiwan Semiconductor Manufacturing Co., Ltd., Hsinchu (TW)

(72) Inventors: Shian-Hung Su, Tainan (TW); Chen-Yung Wang, Kaohsiung (TW); Jia-Ming Lee, Tainan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 211 days.

(21) Appl. No.: 15/964,328

(22) Filed: Apr. 27, 2018

(65) Prior Publication Data

US 2019/0157050 A1 May 23, 2019

Related U.S. Application Data

(60) Provisional application No. 62/588,483, filed on Nov. 20, 2017.

(51) Int. Cl.
| | |
|---|---|
| *C23C 16/40* | (2006.01) |
| *H01J 37/32* | (2006.01) |
| *F04B 37/14* | (2006.01) |
| *H01L 21/67* | (2006.01) |
| *C23C 16/44* | (2006.01) |

(52) U.S. Cl.
CPC .... *H01J 37/32834* (2013.01); *C23C 16/4412* (2013.01); *F04B 37/14* (2013.01); *H01L 21/67017* (2013.01); *H01L 21/6719* (2013.01); *H01L 21/67069* (2013.01); *H01L 21/67098* (2013.01); *H01J 2237/1825* (2013.01)

(58) Field of Classification Search
CPC ........ H01J 37/32834; H01J 2237/1825; H01L 21/6719; H01L 21/67017; H01L 21/67098; H01L 21/67069; C23C 16/4412; F04B 37/14
USPC .......................... 118/715; 156/345.1, 345.29
See application file for complete search history.

(56) References Cited

U.S. PATENT DOCUMENTS

| | | | | |
|---|---|---|---|---|
| 5,053,247 | A * | 10/1991 | Moore | C23C 16/44 118/724 |
| 5,891,350 | A * | 4/1999 | Shan | H01J 37/32477 118/723 E |
| 8,530,242 | B2 | 9/2013 | Lin et al. | |
| 2005/0241176 | A1* | 11/2005 | Shero | C23C 16/4412 34/443 |

(Continued)

*Primary Examiner* — Rudy Zervigon
(74) *Attorney, Agent, or Firm* — McClure, Qualey & Rodack, LLP

(57) ABSTRACT

A processing apparatus is provided. The processing apparatus includes a wafer processing chamber. The processing apparatus further includes a pump configured to evacuate the wafer processing chamber. The pump includes an inlet port located on a lower boundary plane. The processing apparatus also includes an exhaust conduit placed in fluid communication with the gas outlet of the wafer processing chamber and the inlet port of the pump. The exhaust conduit includes a sacrificial tube structure. The sacrificial tube structure is arranged in such a way that a projection of the sacrificial tube structure on the lower boundary plane overlaps the inlet port of the pump.

20 Claims, 5 Drawing Sheets

(56) References Cited

U.S. PATENT DOCUMENTS

2011/0180233 A1\* 7/2011 Bera ................ H01L 21/67109
165/47

\* cited by examiner

PUMP ASSEMBLY FOR CREATING VACUUM IN WAFER PROCESSING CHAMBER

PRIORITY CLAIM AND CROSS-REFERENCE

This application claims the benefit of U.S. Provisional Application No. 62/588,483, filed on Nov. 20, 2017, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

ICs are typically fabricated by processing one or more wafers as a "lot" with a series of wafer fabrication tools (i.e., "processing tools"). Each processing tool typically performs a single wafer fabrication task on the wafers in a given lot. For example, a particular processing tool may perform layering, patterning and doping operations or thermal treatment. A layering operation typically adds a layer of a desired material to an exposed wafer surface. A patterning operation typically removes selected portions of one or more layers formed by layering. A doping operation typically incorporates dopants directly into the silicon through the wafer surface, to produce p-n junctions. A thermal treatment typically heats a wafer to achieve specific results (e.g., dopant drive-in or annealing).

Although existing processing tools have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
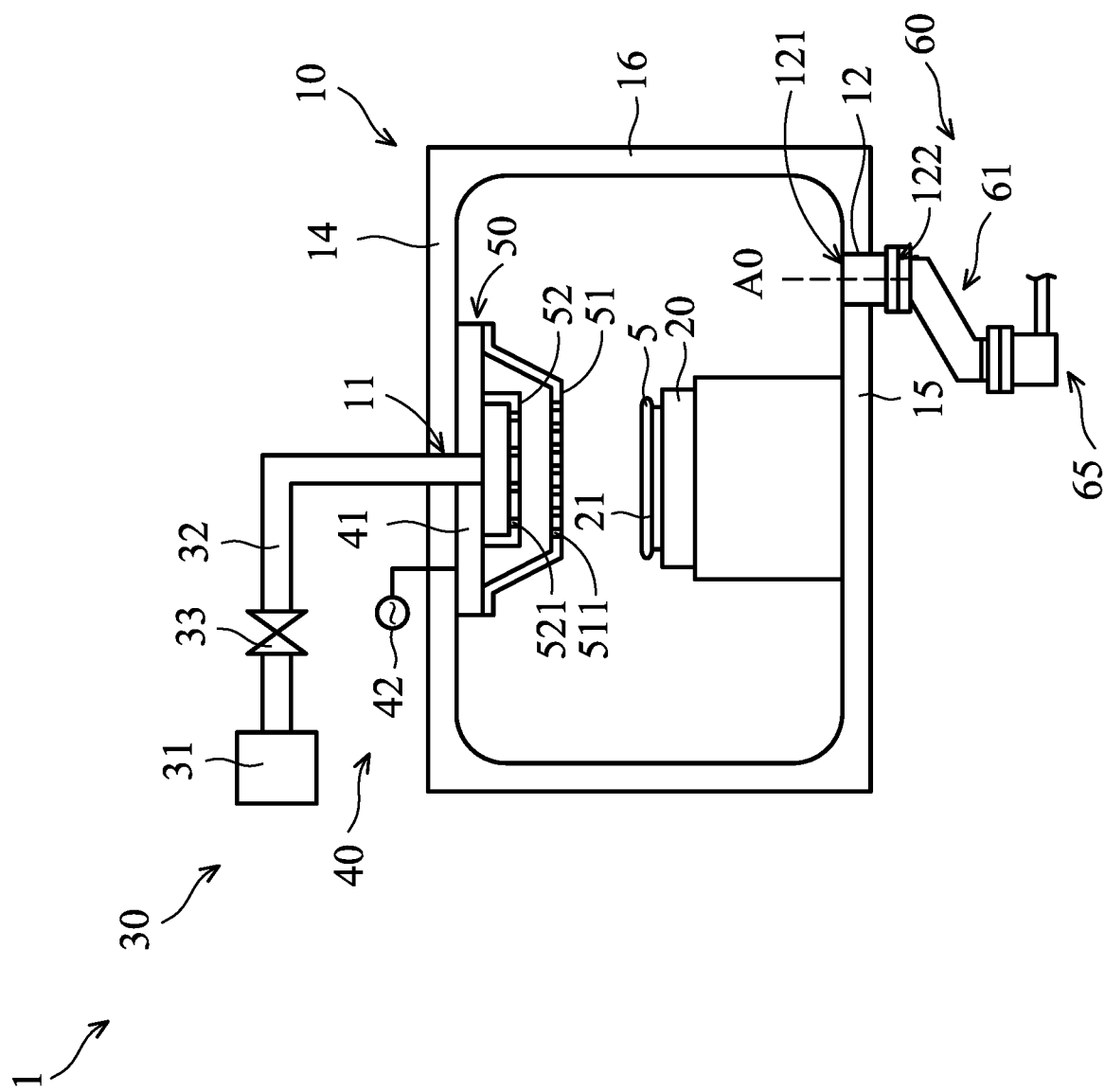
FIG. 1 shows a schematic view of a processing apparatus in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The processing apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIG. 1 is a schematic view of a processing apparatus 1 in accordance with some embodiments. The processing apparatus 1 is configured to perform a semiconductor manufacturing process on a semiconductor wafer 5.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

The semiconductor manufacturing process conducted by the processing apparatus 1 may be any process performed under a vacuum surrounding. For example, the semiconductor manufacturing process is, but not limited to, a plasma cleaning process, a plasma enhancing chemical vapor deposition (PECVD) process, a physical vapor deposition (PVD) process, an etching process, a sputtering deposition process, or an annealing process.

In some embodiments, the processing apparatus 1 is a wafer cleaning apparatus and is configured to perform a cleaning process on the semiconductor wafer 5. The processing apparatus 1 removes impurities and contaminants from surfaces of the semiconductor wafer 5 through the use of an energetic plasma or dielectric barrier discharge (DBD) plasma created from gaseous species.

In the embodiment shown in FIG. 1, the processing apparatus 1 includes a processing chamber 10, a wafer chuck 20, a reaction-gas-supply device 30, a radio frequency device 40, a gas distribution device 50, and a pump assembly 60. It is appreciated that the features described below can be replaced or eliminated in other embodiments of the processing apparatus 1.

The processing chamber 10 may be any desired shape, such as cylindrical shape, hollow square tube, octagonal shape, that may be suitable for dispersing a reaction gas and contacting the reaction gas with the semiconductor wafer 5. The processing chamber 10 may be any suitable material that can withstand the chemistries and pressures involved in the etching process, in an embodiment the processing chamber 10 may be steel, stainless steel, nickel, aluminum, alloys of these, combinations of these, and the like.

The wafer chuck 20 is disposed on a bottom wall 15 of the processing chamber 10. The wafer chuck 20 is configured to support the semiconductor wafer 5. The wafer chuck 20 may hold the semiconductor wafer 5 using a combination of clamps, vacuum pressure, and/or electrostatic forces, and may also include heating and cooling mechanisms in order to control the temperature of the semiconductor wafer 5 during the processes. In some embodiments, the wafer chuck 20 is an electrostatic chuck (E-chuck). The wafer chuck 20 has a supporting surface 21 parallel to with the horizontal plane, and faces the gas distribution device 50. The semiconductor wafer 5 supported by the wafer chuck 20 is in contact with the supporting surface 21.

It should be appreciated that while there is one wafer chuck 20 is illustrated in FIG. 1, this is merely intended for clarity and is not intended to be limiting. Rather, any number of wafer chucks 20 may additionally be included within the processing chamber 10. As such, multiple semiconductor wafer 5s may be etched during a single cleaning process.

The reaction-gas-supply device 30 is configured to supply reaction gases into the processing chamber 10. The reaction gases may include argon and oxygen. Mixtures such as air and hydrogen/nitrogen may be used, as well. In some embodiments, the reaction-gas-supply device 30 includes a reaction-gas container 31, a gas-supply tube 32, and a reaction-gas-supply element 33.

The reaction-gas container 31 is configured to store the reaction gases. The individual reaction-gas container 31 may be a vessel, such as a gas storage tank, that is located either locally to the processing chamber 10 or remotely from the processing chamber 10. Alternatively, the reaction-gas container 31 may be a facility that independently prepares and delivers the reaction gases. Additionally, while only one reaction-gas container 31 is illustrated in FIG. 1, this is done merely for clarity, as any suitable number of reaction-gas container 31, such as one reaction-gas container 31 for each reaction gas desired to be used within the processing chamber 10 may be used.

The gas-supply tube 32 communicates with the reaction-gas container 31 and the processing chamber 10. In some embodiments, one end of the gas-supply tube 32 is connected to the reaction-gas container 31. The other end of the gas-supply tube 32 is connected to a gas inlet 11 of the processing chamber 10. In some embodiments, the gas inlet 11 is located at a top wall of the processing chamber 10. The gas inlet 11 faces the wafer chuck 20, and is located above the center of the supporting surface 21.

The reaction-gas-supply element 33 is installed on the gas-supply tube 32. The reaction-gas-supply element 33 is configured to control the flow rate of the reaction gas in the gas-supply tube 32. In some embodiments, the reaction-gas-supply element 33 is a valve or a pump.

The radio frequency device 40 is configured to generate an electric field in the processing chamber 10 to excite the reaction gas into plasma. The radio frequency device 40 is located at the top of the processing chamber 10, and located over the wafer chuck 20. The radio frequency device 40 includes an electrode 41 and a radio frequency power 42. The electrode 41 is located over the gas distribution device 50. In some embodiments, the electrode 41 is a plate structure parallel with the supporting surface 21. The area of the main surface of the electrode 41 corresponds to the area of the supporting surface 21 of the wafer chuck 20.

The radio frequency power 42 is electrically connected to the electrode 41. The radio frequency power 42 element provides radio frequency energy to the electrode 41. In some embodiments, the wafer chuck 20 is as another electrode 41 of the radio frequency device 40. The radio frequency power 42 is electrically connected to the wafer chuck 20, and the radio frequency power 42 provides radio frequency energy to the wafer chuck 20. In some embodiments, the wafer chuck 20 is grounded.

In some embodiments, the reaction gas (plasma source gas) may be remotely excited outside the processing chamber 10 in a waveguide portion prior to entering into the processing chamber 10 in a downstream plasma process, for example the reaction gases excited by a microwave source e.g., 2.45 GHz in a waveguide portion upstream from the processing chamber 10.

The gas distribution device 50 is disposed in the processing chamber 10, and configured to distribute the reaction gas in the processing chamber 10. In some embodiments, the gas distribution device 50 is located at the top of the processing chamber 10. The gas distribution device 50 is located between the electrode 41 and the wafer chuck 20.

The gas distribution device 50 includes a first shower plate 51 located over the wafer chuck 20. The first shower plate 51 is located between the wafer chuck 20 and the electrode 41. The first shower plate 51 is parallel with the supporting surface 21. In some embodiments, the area of the first shower plate 51 corresponds to the area of the supporting surface 21 of the wafer chuck 20. The first shower plate 51 includes first dispensing holes 511 for the reaction gas to pass through. In some embodiments, the first dispensing holes 511 are arranged in an array. By the first dispensing holes 511, the reaction gas uniformly flows toward the semiconductor wafer 5 or wafer chuck 20.

In some embodiments, the gas distribution device 50 further includes a second shower plate 52 located over the first shower plate 51. The second shower plate 52 is located between the first shower plate 51 and the electrode 41. The second shower plate 52 is parallel with the supporting surface 21, and separated from the first shower plate 51. The second shower plate 52 includes second dispensing holes 521 for the reaction gas to pass through. In some embodiments, the second dispensing holes 521 are arranged in an array. The reaction gas flows uniformly through the second dispensing holes 521 toward the first dispensing holes 511.

Therefore, the uniformity of the reaction gas flowing toward the semiconductor wafer 5 or wafer chuck 20 is improved by the gas distribution device 50.

The pump assembly 60 is configured to remove the gas or plasma in the processing chamber 10. Additionally, once the cleaning process is completed, the pump assembly 60 may be utilized to evacuate the processing chamber 10 in preparation for removal of the semiconductor wafer 5.

In accordance with some embodiments, the pump assembly 60 includes an exhaust conduit 61 and a pump 65. The pump 65 is configured to create a high vacuum (e.g. $7E^{-8}$ torr to about $9E^{-8}$ torr) in the processing chamber 10. In some embodiments, as shown in FIG. 1, the pump 65 is placed in communication with a gas outlet 12 of the processing chamber 10 via the exhaust conduit 61. The gas outlet 12 that communicates with the pump 65 may be formed at a bottom wall 15 of the processing chamber 10.

In some embodiments, the gas outlet 12 is connected to the bottom wall 15 of the wafer processing chamber 10 and is placed in a vicinity of the wafer chuck 20. The gas outlet 12 is a tube structure and extends along a flow axis A0 from an inlet port 121 that faces an interior of the processing chamber 10 to an outlet port 122. The flow axis A0 may be parallel to a vertical direction. However, it should be appreciated that many variations and modifications can be made to embodiments of the disclosure. The gas outlet 12 may be connected at any suitable location of the processing chamber 10. For example, the gas outlet 12 is connected to a side wall 16 of the processing chamber 10.

The exhaust conduit 61 is placed in fluid communication between the wafer processing chamber 10 and the pump 65. Structural features of the exhaust conduit 61, according to different embodiments, are described below.

Figure 2:
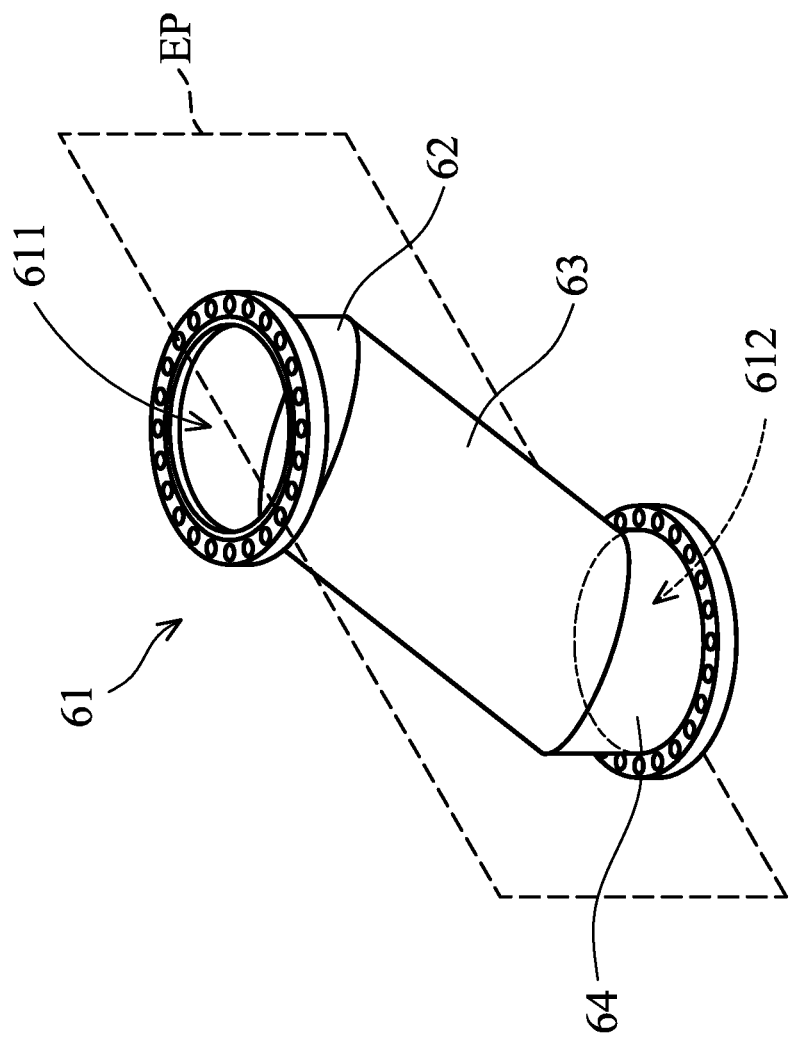
FIG. 2 shows a schematic view of an exhaust conduit, in accordance with some embodiments.
Figure 3:
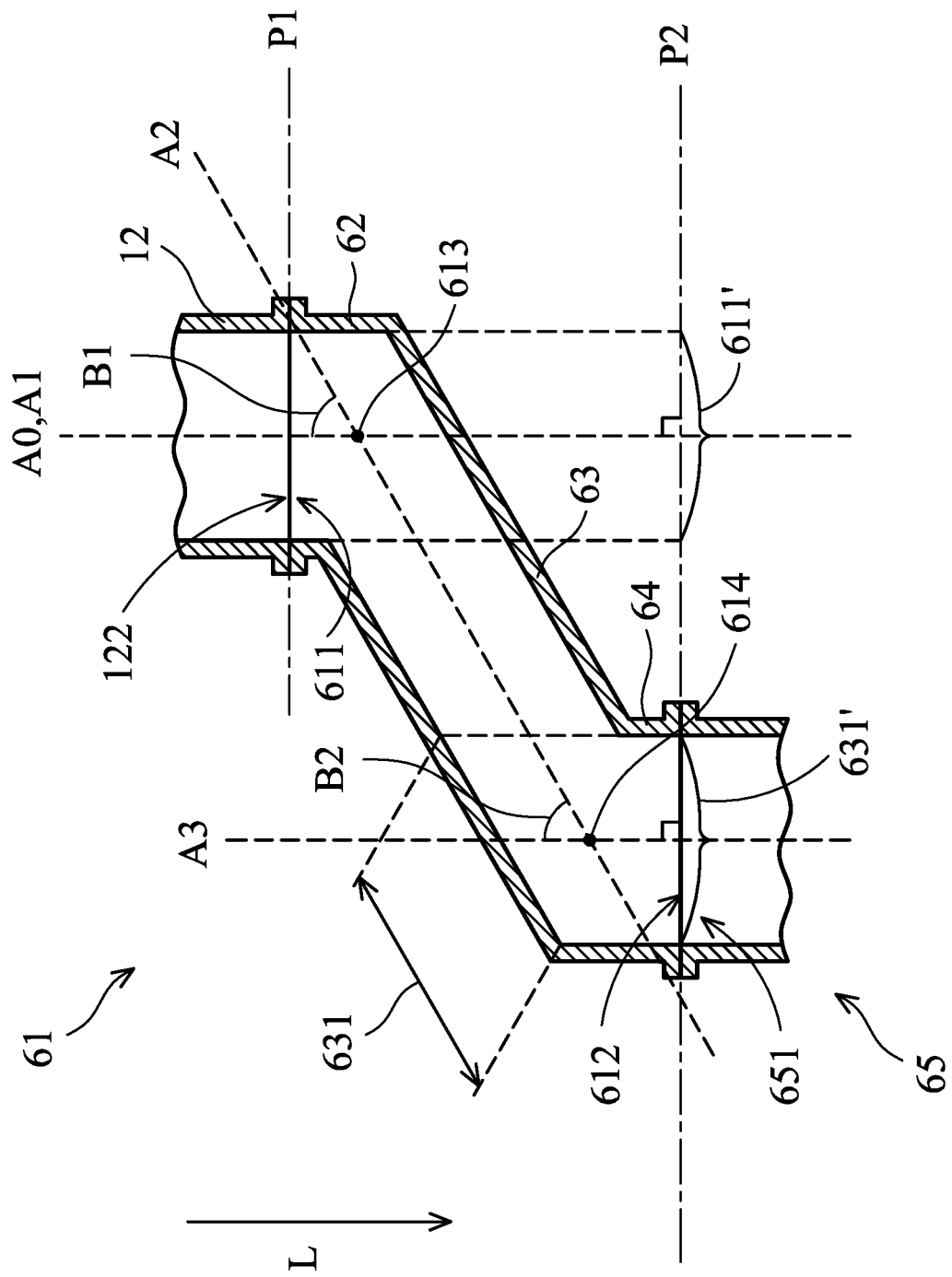
FIG. 3 shows a cross-sectional view of exhaust conduit taken along plane EP of FIG. 2 as connected to a gas outlet and a pump, in accordance with some embodiments.

FIG. 2 shows a schematic view of the exhaust conduit 61, and FIG. 3 shows a cross-sectional view of the exhaust conduit 61 taken along a plane EP of FIG. 2 as connected between the gas outlet 12 and the pump 65, in accordance with some embodiments. In some embodiments, the exhaust conduit 61 includes a number of tube structures, such as upper tube structure 62, sacrificial tube structure 63, and lower tube structure 64. The upper tube structure 62, the sacrificial tube structure 63 and the lower tube structure 64 are arranged in order.

In some embodiments, as shown in FIG. 3, the exhaust conduit 61 is directly connected to the outlet port 122 of the gas outlet 12 via an upper opening 611. In addition, the exhaust conduit 61 is directly connected to an inlet port 651 of the pump 65 via a lower opening 612. The upper opening 611 and the lower opening 612 of the exhaust conduit 61 are formed to be compatible with the gas outlet 12 and the inlet port 651 of the pump 65 and are fixed on the gas outlet 12 and the inlet port 651 by suitable means, such as screwing.

However, it should be appreciated that many variations and modifications can be made to embodiments of the disclosure. In some other embodiments, the pump assembly 60 further includes a gate valve (not shown in figures) positioned between the exhaust conduit 61 and the pump 65. The lower opening 612 is connected to one end of the gate valve, and the inlet port of the pump 65 is connected to the other end of the gate valve.

In some embodiments, as shown in FIG. 3, an upper boundary plane P1 passes through a boundary of the upper opening 611 and the outlet port 122 of the gas outlet 12 and is flush with both the upper opening 611 and the outlet port 122. That is, the upper opening 611 and the outlet port 122 face each other and are located at two sides of the upper boundary plane P1. The upper boundary plane P1 may be a horizontal plane and parallel to the bottom wall 15 of the wafer processing chamber (FIG. 1).

In addition, a lower boundary plane P2 passes through a boundary of the lower opening 612 and inlet port 651 of the pump 65 and is flush with both the lower opening 612 and the inlet port 651. That is, the lower opening 612 and the inlet port 651 face each other and are located at two sides of the lower boundary plane P2. The lower boundary plane P2 may be a horizontal plane and parallel to the first boundary plane P1.

In some embodiments, the exhaust conduit 61 is formed in a non-linear configuration. For example, as shown in FIG. 3, the upper tube structure 62 extends along a passage axis A1 from the upper opening 611 to a first intersection point 613. The passage axis A1 passes through a center of the upper opening 611 and is perpendicular to the lower boundary plane P2. In some embodiments, the passage axis A1 is aligned with the flowing axis A0 on which the gas outlet extends, and as such the flowing axis A0 passes through the lower boundary plane P2 and perpendicular to the lower boundary plane P2.

In addition, the sacrificial tube structure 63 extends along a passage axis A2 from the first intersection point 613 to a second intersection point 614. The passage axis A2 is inclined relative to the lower boundary plane P2. An intersection angle B1 between the passage axis A2 and the passage axis A1 may be in a range from about 55 degrees to about 60 degrees.

Moreover, the lower tube structure 64 extends along a passage axis A3 from the second intersection point 614 to the lower opening 612. The passage axis A3 passes through a center of the lower opening 612 and a center of the inlet port 651 of the pump 65 and is perpendicular to the lower boundary plane P2. An intersection angle B2 between the passage axis A3 and the passage axis A2 may be in a range from about 55 degrees to about 60 degrees.

In some embodiments, the upper opening 611 is offset from the lower opening 612 in a direction L that is perpendicular to the lower boundary plane P2. Specifically, a projecting 611' of the upper opening 611 on the lower boundary plane P2 is offset from the lower opening 612. Therefore, observed from either the upper opening 611 or the lower opening 612, the other one of the upper opening 611 and the lower opening 612 cannot be seen directly. In the cases where the upper boundary plane P1 is substantially parallel to the lower boundary plane P2, the shape of the projection 611' of the upper opening 611 on the lower boundary plane P2 is substantially the same as the real shape of the upper opening 611.

However, it should be appreciated that many variations and modifications can be made to embodiments of the disclosure. In cases where the upper boundary plane P1 is not parallel to the lower boundary plane P2, the shape of the projection 611' of the upper opening 611 on the lower boundary plane P2 may be slightly deformed. In certain embodiments, the upper boundary plane P1 and the lower boundary plane P2 is intersected by an angle less than 90 degrees.

Moreover, at least a portion of a projection of the sacrificial tube structure 63 on the lower boundary plane P2 overlaps the lower opening 612 and the inlet port 651 of the pump 65. For example, a portion of inner surface 631 of the sacrificial tube structure 63 directly faces the lower opening 612 and the inlet port 651. A projection 631' of the portion of inner surface 631 on the lower boundary plane P2 overlaps the lower opening 612 and the inlet port 651. The projection 631' is produced by illuminating a light on the inner surface 631 of the sacrificial tube structure 63 along the direction L that is perpendicular to the lower boundary plane P2

In some embodiments, in operation of creating vacuum by the pump 65, debris that are bounced off the pump 65 and passing through the inlet port 651 and the lower opening 612 are intercepted by the sacrificial tube structure 63 and not allowed entering the wafer processing chamber 10. Therefore, the semiconductor wafer 5 in the processing chamber 10 is protected from being contaminated.

In some embodiments, the sacrificial tube structure 63 is formed symmetrically with the passage axis A2. On the contrary, the upper tube structure 62 and the lower tube structure 64 are formed asymmetrically with respective passage axis A1 and passage axis A3. Therefore, as shown in FIG. 3, the two opposite side walls of the cross section of the sacrificial tube structure 63 have the same length. In contrast, the two opposite side walls of either the upper tube structure 62 or the lower tube structure 64 have different lengths.

In some embodiments, the upper tube structure 62, the sacrificial tube structure 63 and the lower tube structure 64 have the same cross-sectional area in a plane that is perpendicular to the passage axis A1, the passage axis A2 and passage axis A3. In addition, the cross-sectional area of the upper tube structure 62, the sacrificial tube structure 63 and the lower tube structure 64 is as the same at the area of the upper opening 611 and the lower opening 612. With the uniform cross-sectional area, a flow of gas can smoothly passes through the exhaust conduit 61 with the same flow rate.

In some embodiments, since the cross-sectional area of the exhaust conduit 61 is the same as that of the gas outlet 12 and that of the inlet port 651, a pumping efficiency for the wafer processing chamber 10 can be maintained even though a conventional linear exhaust conduit (not shown in figures) is replaced by the non-linear exhaust conduit 61. As a result, there is no need to adjust processing parameters of the processing apparatus 1, and production downtime due to the assembly of the exhaust conduit 61 can be greatly reduced.

Figure 4:
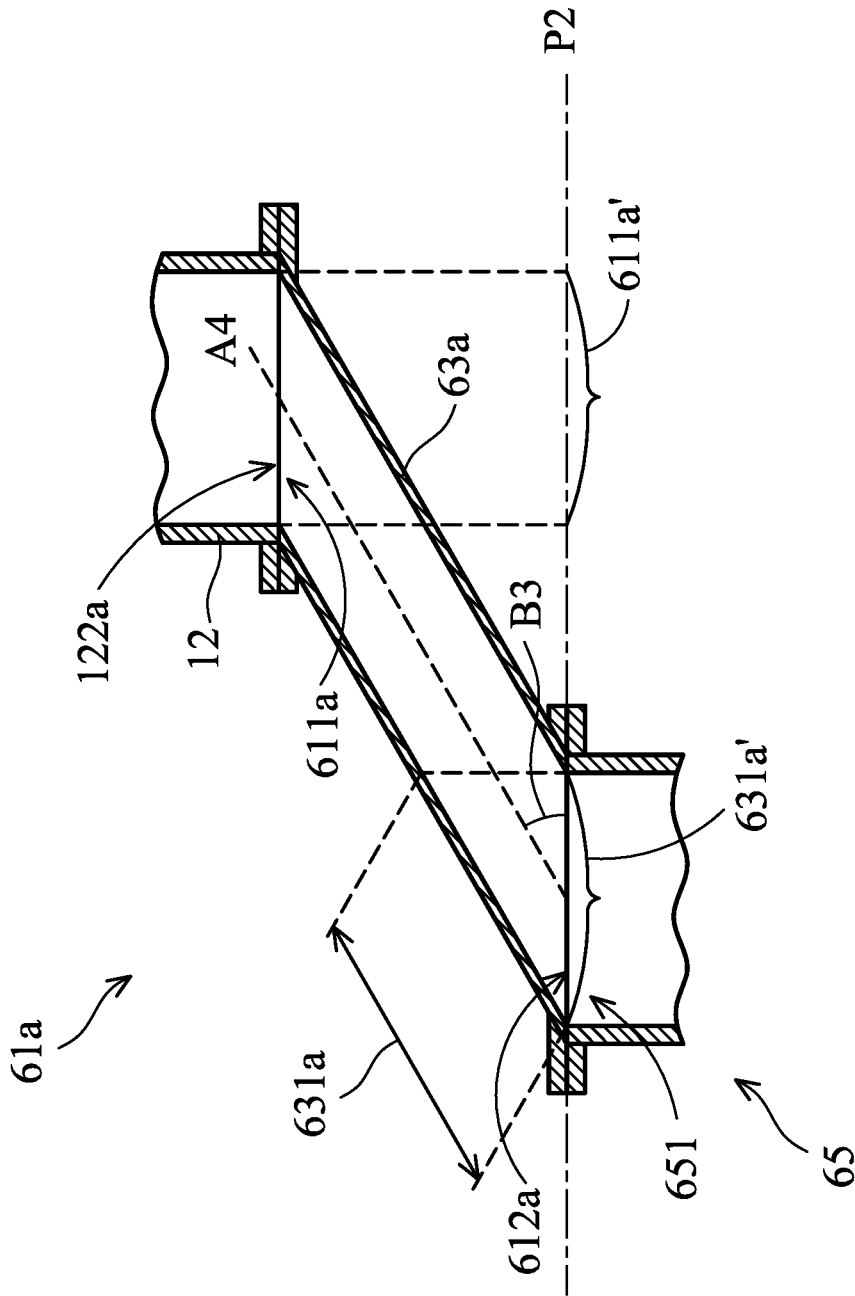
FIG. 4 shows a cross-sectional view of an exhaust conduit, in accordance with some embodiments.

FIG. 4 shows a cross-sectional view of an exhaust conduit 61a, in accordance with some embodiments. In some embodiments, the exhaust conduit 61a includes a sacrificial tube structure 63a connected between an upper opening 611a and a lower opening 612a.

In some embodiments, the exhaust conduit 61a is directly connected to the outlet port 122 of the gas outlet 12 via the upper opening 611a. In addition, the exhaust conduit 61a is directly connected to the inlet port 651 of the pump 65 via the lower opening 612a. The upper opening 611a and lower opening 612a of the exhaust conduit 61a are formed to be compatible with the outlet port 122 of the gas outlet 12 and the inlet port 651 of the pump 65 and fixed on the gas outlet 12 and the inlet port 651 by suitable means, such as screwing. With such arrangements, the exhaust conduit 61a allows a gas communication between the processing chamber 10 (FIG. 1) and the pump 65.

In some embodiments, as shown in FIG. 4, a lower boundary plane P2 passes through a boundary of the lower opening 612a and the inlet port 651 and is flush with both the lower opening 612a and the inlet port 651. That is, the lower opening 612a and the inlet port 651 face each other and are located at two sides of the lower boundary plane P2. The lower boundary plane P2 may be a horizontal plane.

The sacrificial tube structure 63a extends along a passage axis A4 from the upper opening 611 to the lower opening 612. The passage axis A4 is inclined relative to the lower boundary plane P2. An intersection angle B3 between the passage axis A4 and the lower boundary plane P2 may be in a range from about 30 degrees to about 35 degrees.

In some embodiments, the upper opening 611a is offset from the lower opening 612a in a direction L that is perpendicular to the lower boundary plane P2. Specifically, a projecting 611a' of the upper opening 611a on the lower boundary plane P2 is offset from the lower opening 612. Therefore, observed from either the upper opening 611a or the lower opening 612a, the other one of the upper opening 611a and the lower opening 612a cannot be seen directly.

Moreover, at least a portion of a projection of the sacrificial tube structure 63a on the lower boundary plane P2 overlaps the lower opening 612a and the inlet port 651 of the pump 65. For example, a portion of inner surface 631a of the sacrificial tube structure 63a directly faces the lower opening 612a and the inlet port 651. A projection 631a' of the portion of inner surface 631a on the lower boundary plane P2 overlaps the lower opening 612a and the inlet port 651.

In some embodiments, in operation of creating vacuum by the pump 65, debris that are bounced off the pump 65 and passing through the inlet port 651 and the lower opening 612a are intercepted by the sacrificial tube structure 63a and not allowed entering the wafer processing chamber 10 (FIG. 1). Therefore, the semiconductor wafer 5 in the processing chamber 10 (FIG. 1) is protected from being contaminated.

Figure 5:
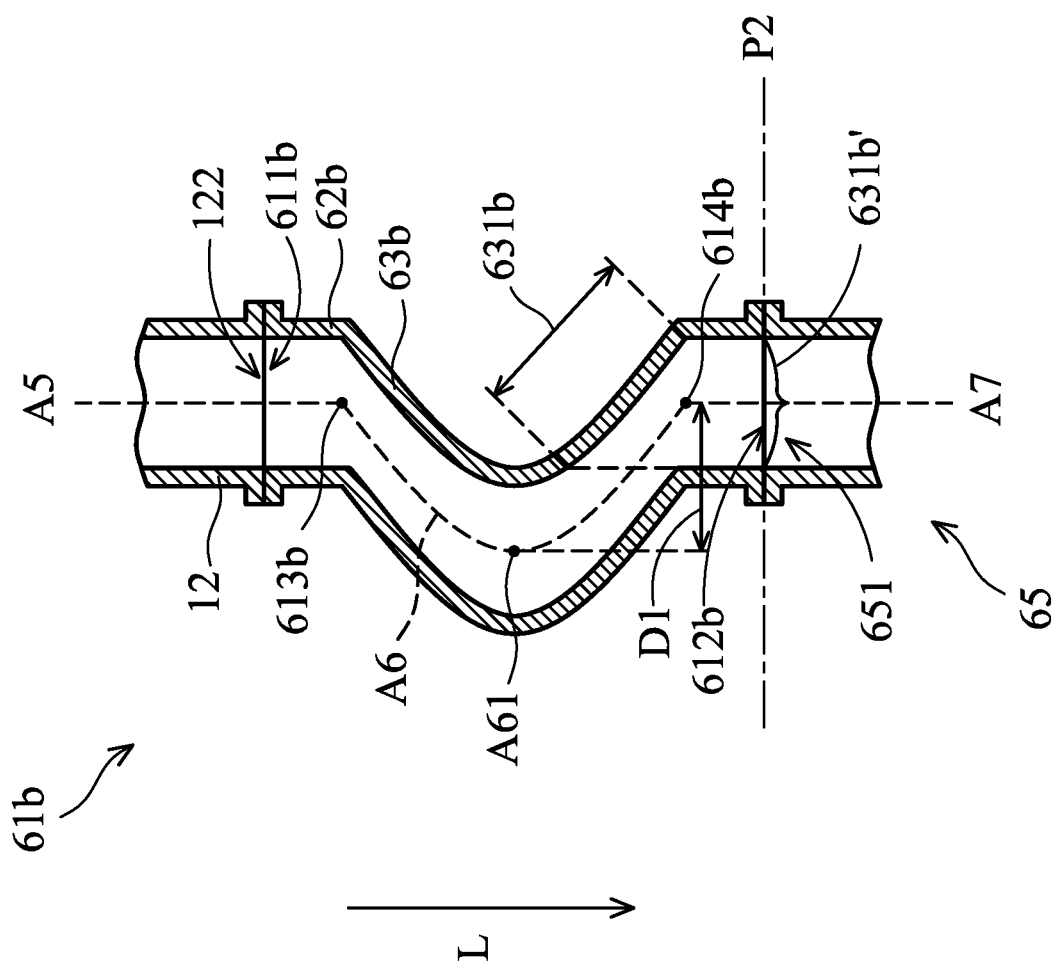
FIG. 5 shows a cross-sectional view of an exhaust conduit, in accordance with some embodiments.

FIG. 5 shows a cross-sectional view of an exhaust conduit 61b, in accordance with some embodiments. In some embodiments, the exhaust conduit 61b includes a number of tube structures, such as upper tube structure 62b, sacrificial tube structure 63b, and lower tube structure 64b. The upper tube structure 62b, the sacrificial tube structure 63b and the lower tube structure 64b are arranged in order.

In some embodiments, the exhaust conduit 61b is directly connected to the gas outlet 12 via an upper opening 611b. In addition, the exhaust conduit 61b is directly connected to the inlet port 651 of the pump 65 via a lower opening 612b. The upper opening 611b and lower opening 612b of the exhaust conduit 61b are formed to be compatible with the gas outlet 12 and the inlet port 651 of the pump 65 and fixed on the gas outlet 12 and the inlet port 651 by suitable means, such as screwing. With such arrangements, the exhaust conduit 61b allows a gas communication between the processing chamber 10 (FIG. 1) and the pump 65.

In some embodiments, as shown in FIG. 5, a lower boundary plane P2 passes through a boundary of the lower opening 612b and the inlet port 651 and is flush with both the lower opening 612b and the inlet port 651. That is, the inlet port 651 and the lower opening 612b face each other and are located at two sides of the lower boundary plane P2. The lower boundary plane P2 may be a horizontal plane.

In some embodiments, the exhaust conduit 61b is formed in a non-linear configuration. Specifically, as shown in FIG. 5, the upper tube structure 62b extends along a passage axis a5 from the upper opening 611b to a first intersection point 613b. The passage axis A5 passes through a center of the upper opening 611b and is perpendicular to the lower boundary plane P2.

In addition, the lower tube structure 64b extends along a passage axis A7 from the second intersection point 614b to the lower opening 612b. The passage axis A7 passes through a center of the lower opening 612b and a center of the inlet port 651 of the pump 65 and is perpendicular to the lower boundary plane P2.

Moreover, the sacrificial tube structure 63b extends along a curved passage axis A6 from the first intersection point 613 to a second intersection point 614b. The curved passage axis A6 includes a vertex A61. The vertex A61 is a point where the passage axis A6 is most away from a passage axis A7 and is most sharply curved. The vertex A61 is apart from passage axis A7 by a distance D1. The distance D1 is greater than a half of the width of the lower tube structure 64b.

In some embodiments, the upper opening 611b is aligned with the lower opening 612b in a direction L that is perpendicular to the lower boundary plane P2. However, because the curved cross section of the sacrificial tube structure 63b, when the lower opening 612b is observed from the bottom, the upper opening 611b cannot be seen directly.

Moreover, at least a portion of a projection of the sacrificial tube structure 63b on the lower boundary plane P2 overlaps the lower opening 612b and the inlet port 651 of the pump 65. For example, a portion of inner surface 631b of the sacrificial tube structure 63b directly faces the lower opening 612b and the inlet port 651. A projection 631b' of the portion of inner surface 631b on the lower boundary plane P2 overlaps the lower opening 612b and the inlet port 651.

In some embodiments, in operation of creating vacuum by the pump 65, debris that are bounced off the pump 65 and passing through the inlet port 651 and the lower opening 612b are intercepted by the sacrificial tube structure 63b and not allowed entering the wafer processing chamber 10 (FIG. 1). Therefore, the semiconductor wafer 5 in the processing chamber is protected from being contaminated.

Embodiments of creating a vacuum in a processing apparatus in a semiconductor fabrication described above use an exhaust conduit to connect a wafer processing chamber to a pump. The exhaust conduit allows the gas flow to pass through but efficiently dislodge contaminant particles which may lead to a reduction of semiconductor wafer yield. Therefore, wafer scrap can be prevented. In addition, since most particles are blocked by the exhaust conduit, the time period for shutting off the processing apparatus for a cleaning processing can be prolonged, and fabrication cost and time are reduced.

In accordance with some embodiments, a processing apparatus is provided. The processing apparatus includes a wafer processing chamber having a gas outlet. The processing apparatus further includes a pump configured to evacuate the wafer processing chamber. The pump includes an inlet port located on a lower boundary plane. The gas outlet of the wafer processing chamber extends along a flowing axis that passes through the lower boundary plane. The processing apparatus also includes an exhaust conduit placed in fluid communication with the gas outlet of the wafer processing chamber and the inlet port of the pump. The exhaust conduit includes a sacrificial tube structure. The sacrificial tube structure extends along a passage axis that is inclined relative to the lower boundary plane and includes an inner surface that faces the inlet port of the pump.

In accordance with some embodiments, a processing apparatus is provided. The processing apparatus includes a wafer processing chamber. The processing apparatus further includes a pump configured to evacuate the wafer processing chamber. The processing apparatus also includes an exhaust conduit placed in fluid communication with the wafer processing chamber and the pump. The exhaust conduit includes an upper opening and a lower opening. The lower opening is connected to the pump and located on a lower boundary plane. The upper opening is connected to the wafer processing chamber, and a projection of the upper opening on the lower boundary plane is offset from the lower opening.

In accordance with some embodiments, a processing apparatus is provided. The processing apparatus includes a wafer processing chamber. The processing apparatus further includes a pump configured to evacuate the wafer processing chamber. The processing apparatus also includes an exhaust conduit placed in fluid communication with the wafer processing chamber. The exhaust conduit includes a number of tube structures arranged in order. At least two of the tube structures that are immediately connected extend along respective passage axes that are intersected by an angle in a range from about 55 degrees to about 60 degrees.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A processing apparatus for processing a semiconductor wafer, comprising: a wafer processing chamber having a gas outlet; a pump configured to evacuate the wafer processing chamber and comprising an inlet port located on a lower boundary plane, wherein the gas outlet of the wafer processing chamber extends along a flowing axis that passes through the lower boundary plane; and an exhaust conduit placed in fluid communication with the gas outlet of the wafer processing chamber and the inlet port of the pump and comprising, a sacrificial tube structure extending along a passage axis that is inclined relative to the lower boundary plane and comprising an inner surface that faces the inlet port of the pump; an upper opening connected to the wafer processing chamber; and a lower opening connected to the inlet port of the pump, wherein the upper opening is aligned with the lower opening in a direction that is perpendicular to the lower boundary plane.

2. The processing apparatus as claimed in claim 1, wherein the sacrificial tube structure extends along a direction that is inclined relative to the lower boundary plane.

3. The processing apparatus as claimed in claim 1, wherein the sacrificial tube structure extends along a curved passage axis.

4. The processing apparatus as claimed in claim 1, wherein the sacrificial tube structure is arranged in such a way that a projection of the inner surface of the sacrificial tube structure on the lower boundary plane overlaps the inlet port of the pump, the projection of the inner surface is produced in a direction that is perpendicular to the lower boundary plane.

5. The processing apparatus as claimed in claim 1, wherein the exhaust conduit has a uniform cross-sectional area from the upper opening to the lower opening.

6. A processing apparatus for processing a semiconductor wafer, comprising: a wafer processing chamber; a pump configured to evacuate the wafer processing chamber; and an exhaust conduit placed in fluid communication with the wafer processing chamber and the pump and comprising: an upper opening connected to the water processing chamber; and a lower opening connected to the pump; wherein the lower opening is located on a lower boundary plane, and a projection of the upper opening on the lower boundary plane is offset from the lower opening, wherein the exhaust conduit has a uniform inner cross-sectional area from the upper opening to the lower opening.

7. The processing apparatus as claimed in claim 6, wherein the exhaust conduit further comprises: a sacrificial tube structure positioned between the upper opening and the lower opening; wherein the sacrificial tube extends in a direction that is inclined relative to the lower boundary plane.

8. The processing apparatus as claimed in claim 7, wherein the sacrificial tube structure comprises an inner surface that directly faces the lower opening.

9. The processing apparatus as claimed in claim 7, wherein a projection of the sacrificial tube structure on the lower boundary plane overlaps the lower opening.

10. The processing apparatus as claimed in claim 6, wherein the exhaust conduit further comprises: a sacrificial tube structure positioned between the upper opening and the lower opening of the exhaust conduit; wherein the sacrificial tube extends along a curved passage axis.

11. The processing apparatus as claimed in claim 6, wherein a passage axis passes through a center of the upper opening is substantially perpendicular to the lower boundary plane.

12. A processing apparatus for processing a semiconductor wafer, comprising: a wafer processing chamber; a pump configured to evacuate the wafer processing chamber; and an exhaust conduit placed in fluid communication with the wafer processing chamber and the pump and comprising at an upstream half of a sacrificial tube structure and a downstream half of the sacrificial tube structure arranged in a vertical direction of a lower boundary plane; wherein each of the upstream half of the sacrificial tube structure and the downstream half of the sacrificial tube structure has a uniform cross-sectional area, the upstream half of the sacrificial tube structure and the downstream half of the sacrificial tube structure extend along different directions, and the length of the upstream half of the sacrificial tube structure in a tangent direction of the lower boundary plane is identical to the length of the downstream half of the sacrificial tube structure in the tangent direction of the lower boundary plane.

13. The processing apparatus as claimed in claim 12, wherein the exhaust conduit comprises: an upper opening connected to the wafer processing chamber; and an lower opening connected to the pump; wherein the upstream and downstream halves of the sacrificial tube structure are connected between the upper opening and the lower opening, and at least one of the upstream and downstream halves of the sacrificial tube structure extends in a direction that is inclined relative to a lower boundary plane on which the lower opening is located.

14. The processing apparatus as claimed in claim 13, wherein the upper opening is offset from the lower opening in a direction that is perpendicular to the lower boundary plane.

15. The processing apparatus as claimed in claim 13, wherein the upper opening is aligned with the lower opening in a direction that is perpendicular to the lower boundary plane.

16. The processing apparatus as claimed in claim 1, further comprising a radio frequency device disposed in the wafer processing chamber.

17. The processing apparatus as churned in claim 1, when observed from the lower opening, the upper opening cannot be seen directly.

18. The processing apparatus as claimed in claim 12, further comprising a gate valve positioned between the exhaust conduit and the pump.

19. The processing apparatus as claimed in claim 12, further comprising a gas distribution device disposed in the wafer processing chamber, wherein the gas distribution device comprises a plurality of shower plates positioned above the semiconductor wafer.

20. The processing apparatus as claimed in claim 12, wherein the exhaust conduit further comprises a gas outlet tube structure and an inlet port tube structure, the inlet port tube structure, the upstream half of the sacrificial tube structure, the downstream half of the sacrificial tube structure, and the gas outlet tube structure are arranged in order and extended in a vertical direction of a lower boundary plane, wherein each of the upstream half of the sacrificial tube structure, the downstream half of the sacrificial tube structure, the gas outlet tube structure, and the inlet port tube structure has a uniform cross-sectional area, and the gas outlet tube structure and the inlet port tube structure extend along an identical direction and are coaxial.

\* \* \* \* \*